United States Patent
Tzeng et al.

(10) Patent No.: US 6,376,294 B1
(45) Date of Patent: Apr. 23, 2002

(54) METHOD TO DEFINE POLY DOG-BONE FOR WORD LINE STRAPPING CONTACT AT STITCH AREA IN EMBEDDED DRAM PROCESS

(75) Inventors: Kuo-Chyuan Tzeng; Wen-Chuan Chiang; Wen-Cheng Chen; Chen-Jong Wang, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/755,686

(22) Filed: Jan. 8, 2001

(51) Int. Cl.[7] ........................................... H01L 21/8238
(52) U.S. Cl. ........................ 438/210; 438/253; 438/279
(58) Field of Search ................................ 438/200, 210, 438/253, 275, 279, 256, 396, 294

(56) References Cited

U.S. PATENT DOCUMENTS 5,583,356 A * 12/1996 Yoon et al. .................. 257/296
6,080,620 A *  6/2000 Jeng ............................. 438/253
6,143,604 A * 11/2000 Chiang et al. .............. 438/253

* cited by examiner

Primary Examiner—Charles Bowers
Assistant Examiner—Jack Chen

(74) Attorney, Agent, or Firm—George O. Saile; Stephen B. Ackerman; Stephen G. Stanton

(57) ABSTRACT

A method for fabricating a dog-bone in a DRAM device, comprising the following steps. A semiconductor structure having an upper silicon layer with STIs formed therein is provided. The semiconductor structure has a LOGIC region and a DRAM region with a stitch region therebetween. A polysilicon layer is formed over the semiconductor structure. A dopant is selectively implanted in the polysilicon region within the DRAM region, and the portion of the stitch region within the DRAM region, to form a doped poly segment, and an undoped poly segment within the LOGIC region, and the portion of the stitch region within the LOGIC region. A hard mask is formed over the doped poly segment and the undoped poly segment and patterned to form at least one patterned first hard mask portion only over the word line doped poly segment within the DRAM region. At least one second mask layer portion is formed over the undoped poly segment within the LOGIC region and at least one third mask layer portion is formed over the doped poly segment in the portion of the stitch region within the DRAM region. The doped poly segment and undoped poly segment are etched to form: undoped poly periphery logic gate portions within the LOGIC region; doped poly dog-bone within the portion of the stitch region within the DRAM region; and doped poly word lines within the DRAM region. The second and third mask layer portions are stripped to expose the undoped poly periphery logic gate portions and the doped poly dog-bone.

28 Claims, 6 Drawing Sheets

METHOD TO DEFINE POLY DOG-BONE FOR WORD LINE STRAPPING CONTACT AT STITCH AREA IN EMBEDDED DRAM PROCESS

FIELD OF THE INVENTION

The present invention relates generally to fabrication of DRAM integrated circuit devices and specifically to word line strapping methods in DRAM integrated circuit devices.

BACKGROUND OF THE INVENTION

A dynamic random access memory (DRAM) includes a large number of memory cells, each of which can store at least one bit of data. The memory cells are arranged in an array having a number of columns and rows. Memory cells within the same column are commonly coupled to a bit line and memory cells within the same row are commonly coupled to a word line. The memory cells within the array are accessed according to various memory device operations such as read operations, write operations, and refresh operations.

Generally, the word lines are comprised of an N-type polysilicon that contains phosphorous as an impurity (N-doped poly). The resistance of the doped poly word lines is very high as compared to that of a metal and the signal speed decreases due to the resistance of the word lines.

A method of depositing metal layers with a certain interval over the word lines is frequently used and is known as word line strapping. That is, word line strapping skill is commonly used to reduce RC delay as memory cells are accessed through word line gates in DRAM circuits.

However, word lines are often comprised of an overlying SiN hard mask, tungsten silicide ($WSi_x$) layer, then doped poly in DRAM circuits. The hard mask is utilized because it can improve self-aligned contact etching window which can increase DRAM cell density.

Based upon the above advantages, the SiN hard mask for self-aligned contact and word line strapping skill for reducing RC delay are always used for DRAM processes and circuit design. In order to make sure word line strapping perfectly contacts on doped poly or $WSi_x$, the SiN hard mask must first be opened in advance of the word strapping. This leads to additional fabrication steps, increased fabrication complexity, and increased fabrication cost.

For example, U.S. Pat. No. 5,081,516 to Haskell et al describes word line strapping and dog-bone contacts.

U.S. Pat. No. 5,409,860 to Jeon, U.S. Pat. No. 6,064,589 to Walker, U.S. Pat. No. 5,959,319 to Iwasa, and U.S. Pat. No. 5,583,356 to Yoon et al. describe various word line strapping methods.

SUMMARY OF THE INVENTION

Accordingly, it is an object of the present invention is to provide an improved method to define a poly dog-bone for word line strapping contact at stitch area in embedded DRAM process.

Another object of the present invention is to provide a method of defining a poly dog-bone for word strapping contact without an overlying hard mask.

Other objects will appear hereinafter.

It has now been discovered that the above and other objects of the present invention may be accomplished in the following manner. Specifically, a semiconductor structure having an upper silicon layer with STIs formed therein is provided. The semiconductor structure has a LOGIC region and a DRAM region with a stitch region therebetween. A polysilicon layer is formed over the semiconductor structure. A dopant is selectively implanted in the polysilicon region within the DRAM region, and the portion of the stitch region within the DRAM region, to form a doped poly segment, and an undoped poly segment within the LOGIC region, and the portion of the stitch region within the LOGIC region. A hard mask is formed over the doped poly segment and the undoped poly segment and patterned to form at least one patterned first hard mask portion only over the word line doped poly segment within the DRAM region. At least one second mask layer portion is formed over the undoped poly segment within the LOGIC region and at least one third mask layer portion is formed over the doped poly segment in the portion of the stitch region within the DRAM region. The doped poly segment and undoped poly segment are etched to form:

undoped poly periphery logic gate portions within the LOGIC region;

doped poly dog-bone within the portion of the stitch region within the DRAM region; and doped poly word lines within the DRAM region.

The second and third mask layer portions are stripped to expose the undoped poly periphery logic gate portions and the doped poly dog-bone.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Process Known to the Inventors

The following process known to the inventors of forming a dog-bone structure is a DRAM device is not to be considered prior art for the purposes of the instant invention.

An undoped polysilicon (undoped poly) layer is formed over the logic region in the periphery, and the DRAM region of a silicon wafer having shallow trench isolation regions (STIs) formed therein. A stitch region is located between the logic region and the DRAM region.

The undoped poly layer is patterned, leaving an undoped poly layer only over the logic region. The patterning is usually done by a photoresist masking process.

A doped poly layer is then formed over the undoped poly in the logic region and over the DRAM region. A TEOS oxide layer and a SiN layer are then formed over the doped poly layer.

The SiN/TEOS/doped poly/undoped poly layer in the logic region and the SiN/TEOS/doped poly layer in the DRAM region are then patterned (usually by a photoresist masking process) to form SiN/TEOS/doped poly/undoped poly stacks in the logic region (periphery logic gate), SiN/

TEOS/doped poly stacks in the DRAM region (word lines), and a SiN/TEOS/doped poly stack (dog-bone) in the portion of the stitch region adjacent to the DRAM region.

To contact the doped poly layer in the dog-bone SiN/TEOS/doped poly stack, a mask layer must be formed over the structure and patterned to exposed the dog-bone SiN/TEOS/doped poly stack. The SiN/TEOS layers of the dog-bone SiN/TEOS/doped poly stack are etched and removed to expose the doped poly layer of the dog-bone structure in the stitch area.

Preferred Embodiment of the Present Invention

Unless otherwise specified, all structures, layers, steps, methods, etc. may be formed or accomplished by conventional steps or methods known in the prior art.

Initial Structure

Figure 1:
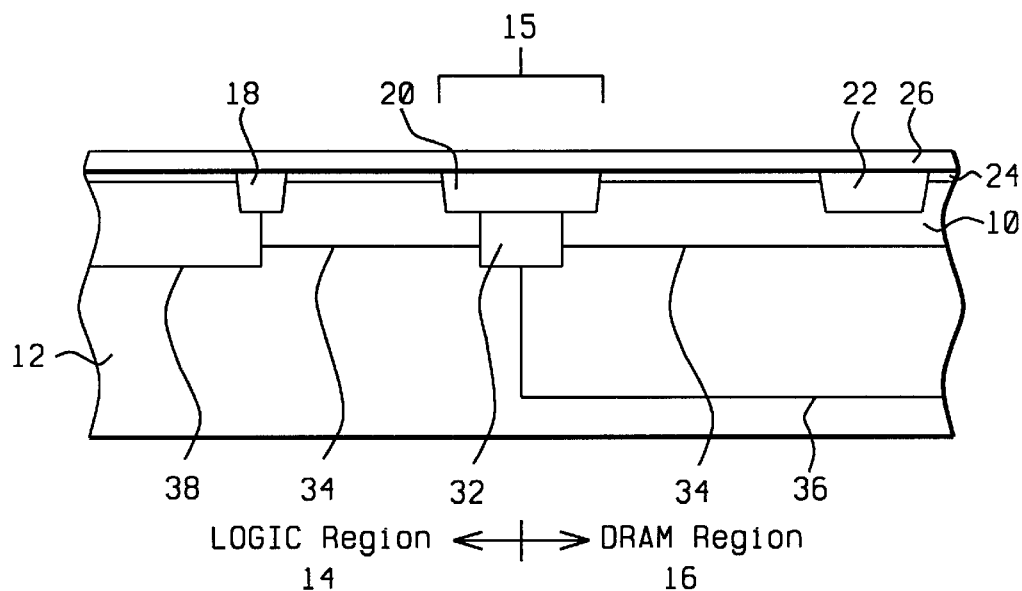
FIGS. 1 to 7 illustrate the preferred embodiment of the present invention, with FIGS. 5A and 5B illustrating alternative P1L mask layer portions.

As shown in FIG. 1, semiconductor structure 10 is preferably a silicon wafer that has P-type doped area 12. Substrate 10 is divided into LOGIC region 14 and DRAM region 16 with stitch area 15 therebetween. Shallow trench isolation areas 18, 20, 22 (STIs) are formed within substrate 10 with STI 20 within stitch area 15.

Gate oxide layer 24 is grown over substrate 10 apart from STIs 18, 20, 22 to a thickness of preferably from about 16.5 to 70 Å, more preferably from about 40 to 60 Å, and most preferably about 50 Å.

STI 20 within stitch area 15 has deep N-well guard ring (isolated P-well & reverse well (or P-well in DNW)) (DNWG) 32 beneath it with deep N-well (DNW) 36 connected to DNWG 32. P-wells (PW) 34 also connect to DNWG 32, with one PW 34 connecting to N-well (NW) 38 that is connected to STI 18 within LOGIC region 14.

Formation of Unitary Polysilicon Layer 26

In a key step of the invention, a single, unitary polysilicon (poly) layer 26 is then formed over the structure to a thickness of preferably from about 1600 to 2000 Å, more preferably from about 1700 to 1900 Å, and most preferably about 1800 Å. This permits only a single furnace step.

P/As Implantation of Word Line Poly Segment 28

Figure 2:
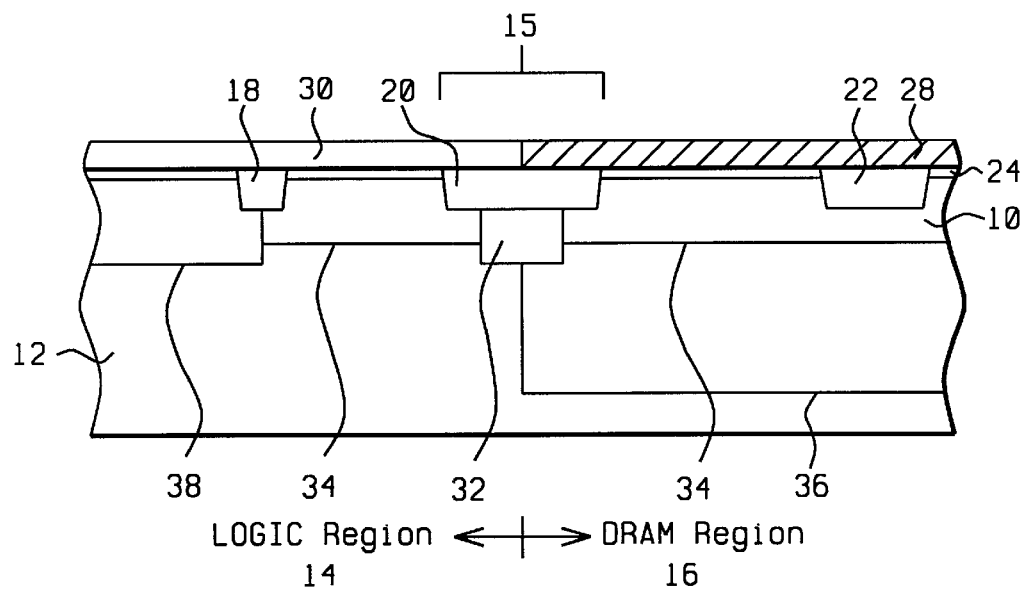

As shown in FIG. 2, poly layer 26 is then selectively implanted with phosphorous (P) and/or arsenic (As) (P/As) within DRAM region 16 and in stitch region 15 adjacent DRAM region 16. This forms word line doped poly segment 28 and LOGIC region 14/periphery area undoped poly segment 30. LOGIC region 14 is masked before the P/As implantation.

The concentration of P ([P]) within word line doped poly segment 28 is preferably from about 5 E 19 atoms/cm$^3$ to 5 E 21 atoms/cm$^3$, and is more preferably from about 1 E 20 atoms/cm$^3$ to 1 E 21 atoms/cm$^3$. The concentration of As ([As]) within word line doped poly segment 28 is preferably from about 5 E 19 atoms/cm$^3$ to 5 E 21 atoms/cm$^3$, and is more preferably from about 1 E 20 atoms/cm$^3$ to 1 E 21 atoms/cm$^3$.

Formation of Hard Mask Layer 44

Figure 3:
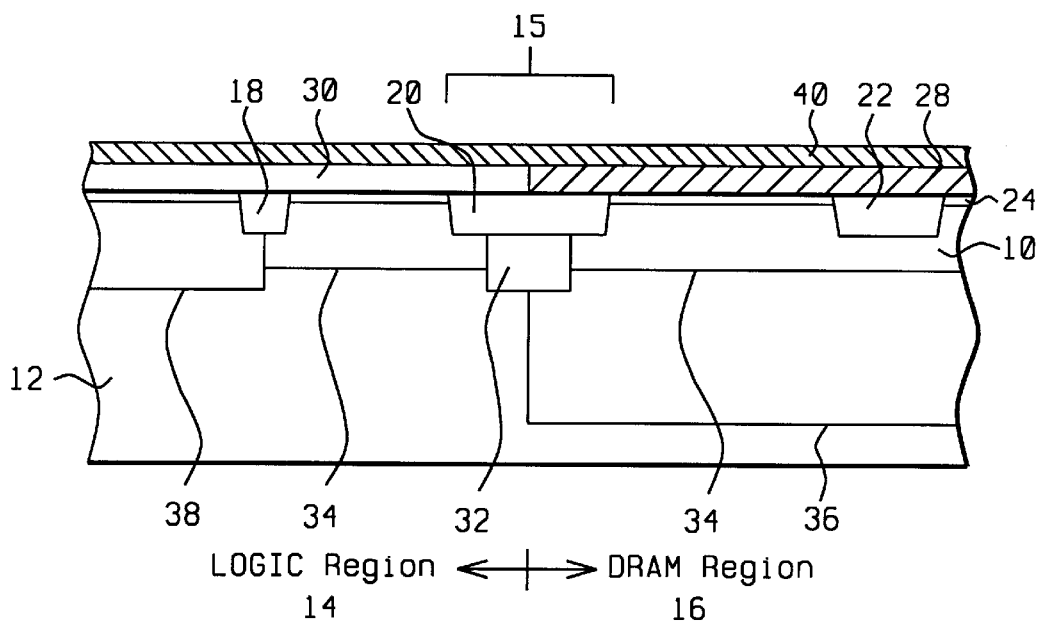

As shown in FIG. 3, low pressure TEOS (LPTEOS) layer 40 is formed over word line doped poly segment 28 and LOGIC region undoped poly segment 30 to a thickness of preferably from about 600 to 800 Å, more preferably from about 650 to 750 Å, and most preferably about 700 Å.

Figure 4:
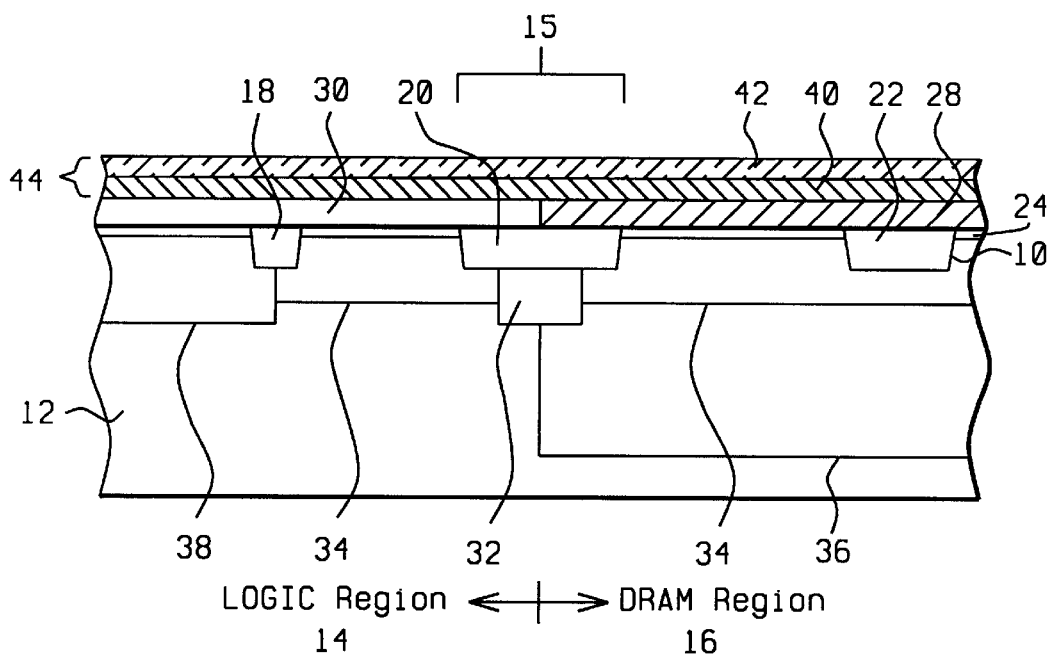

As shown in FIG. 4, layer 42 (preferably formed of SiN) is formed over LPTEOS layer 40 to a thickness of preferably from about 1300 to 1700 Å, more preferably from about 1400 to 1600 Å, and most preferably about 1500 Å.

LPTEOS layer 40 and SiN layer 42 form hard mask layer 44 having a thickness preferably from about 1900 to 2500 Å, more preferably from about 2050 to 2350 Å, and most preferably about 2200 Å.

Formation of Patterned Hard Mask Portions 44'

Figure 5A:
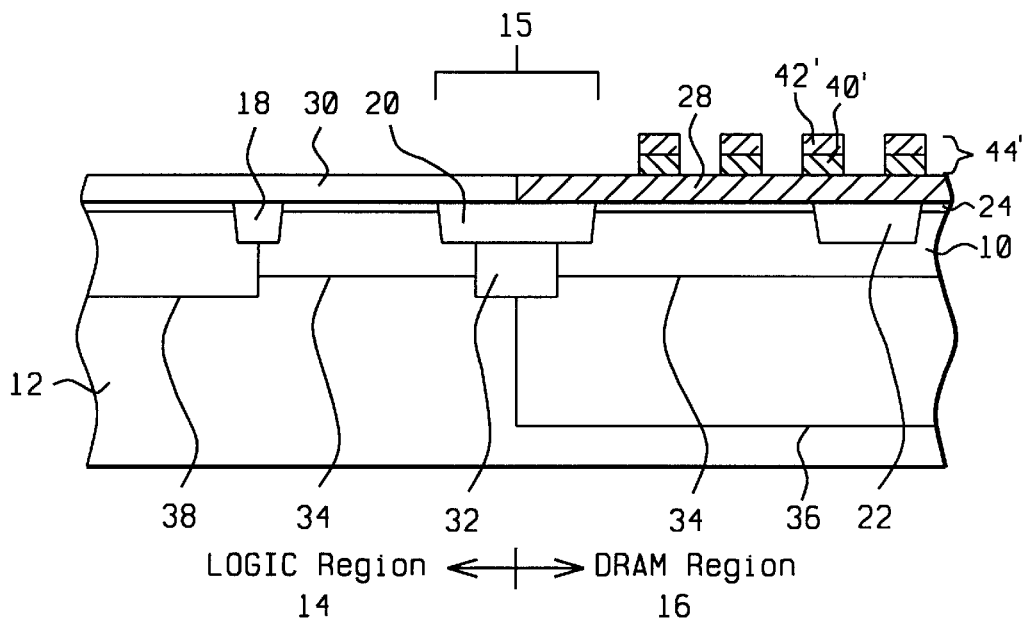

As shown in FIG. 5A, patterned DRAM word line (1$^{st}$ poly layer (P1) word line (W) or just "P1W") mask layer (not shown) is formed over hard mask layer 44. Hard mask layer 44 is then etched, using patterned P1W mask layer as a mask, to form patterned hard mask portions 44' over word line doped poly segment 28. Hard mask portions 44' consist of patterned SiN layer portions 42' and patterned LPTEOS layer portions 40'.

P1W mask may consist of a photoresist layer, for example.

Figure 6:
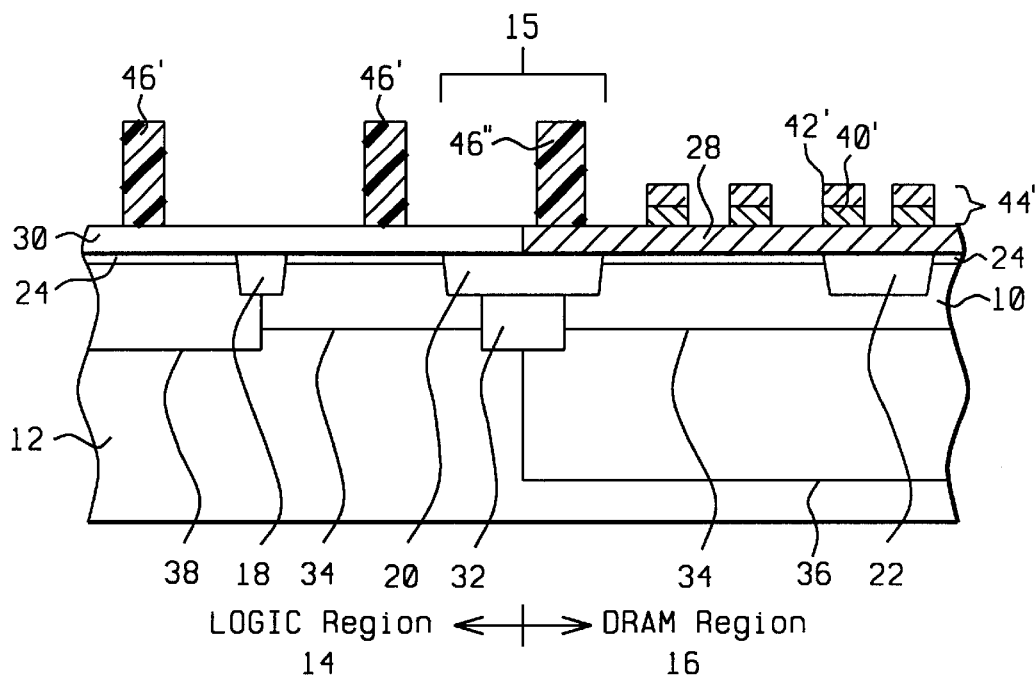

Formation of Periphery Logic Gate 30', Patterned Word Lines 28' With Hard Mask 44', and Dog-Bone 48 Without Hard Mask In another key step of the invention and as shown in FIG. 6, logic gate (poly 1 (P1) of Logic portion (L) or just "P1L") mask layer is formed and patterned to form patterned P1L mask layer portions 46' over undoped poly segment 30 and patterned P1L mask layer portion 46" over a portion of word line doped poly segment 28 within stitch area 15.

The P1L mask layer may be formed of photoresist, for example.

Figure 5B:
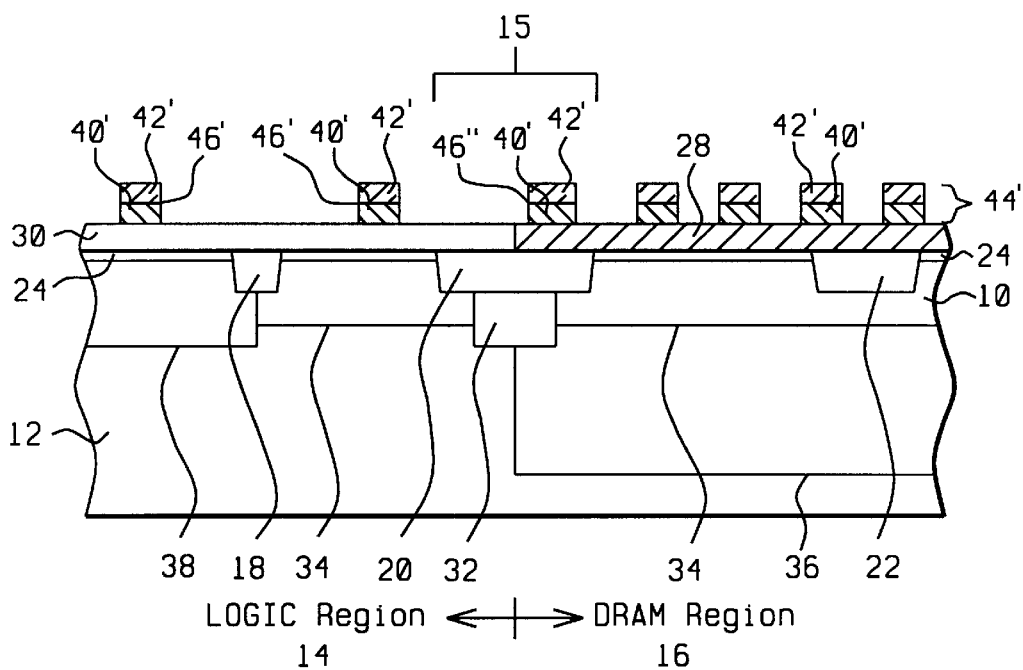

Alternatively, as shown in FIG. 5B, P1L mask layer portions 46' over undoped poly segment 30 and patterned P1L mask layer portion 46" over a portion of word line doped poly segment 28 within stitch area 15 may be comprised of structures equivalent to the patterned hard mask portion structures 44'.

Figure 7:
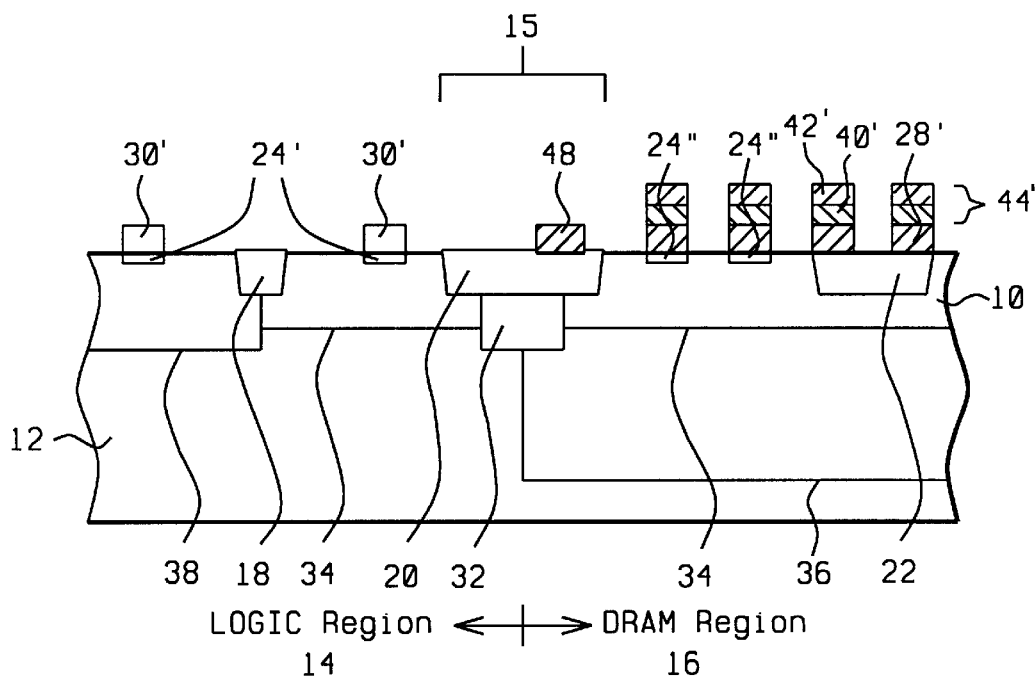

As shown in FIG. 7, using patterned P1L mask layer portions 46', 46" and hard mask portions 44' as masks (and sometimes it might be with hard masks portions at 46', 46" (not shown) analogous to hard mask portions 44'), the structure is etched to form:

periphery logic gate portions 30' (with underlying patterned gate oxide portions 24') within LOGIC region 14 under patterned, P1L mask portions 46';

dog-bone 48 comprising a portion of doped poly segment 28 within stitch area 15 adjacent DRAM region 16 and under patterned P1L mask portion 46"; and word lines 28' (with underlying patterned gate oxide portions 24" not over STI 22) within DRAM region 16 under hard mask portions 44'.

As indicted above, the portions of gate oxide layer 24 not under patterned P1L mask layer portions 46', 46" or hard mask portions 44' are also etched.

This method of the present invention permits the definition of the poly layer 30, 28 for both the logic and the DRAM at the same time, i.e. a common gate (logic gate and DRAM word line) is formed.

Patterned P1L mask 46' is stripped from the structure, exposing periphery logic gate portions 30' within LOGIC region 14 and dog-bone 48 within stitch area 15 adjacent DRAM region 16.

It is noted that fabricating dog-bone 48 in accordance wire the method of the present invention avoids the use of a hard mask portion to form the dog-bone and therefore eliminates the required extra processes to remove a hard mask portion from over the dog-bone. Stripping and removal of a patterned photoresist P1L mask portion 46" over dog-bone 48 is an easier, quicker and less expensive ordeal.

Further Processing

Figure 8A:
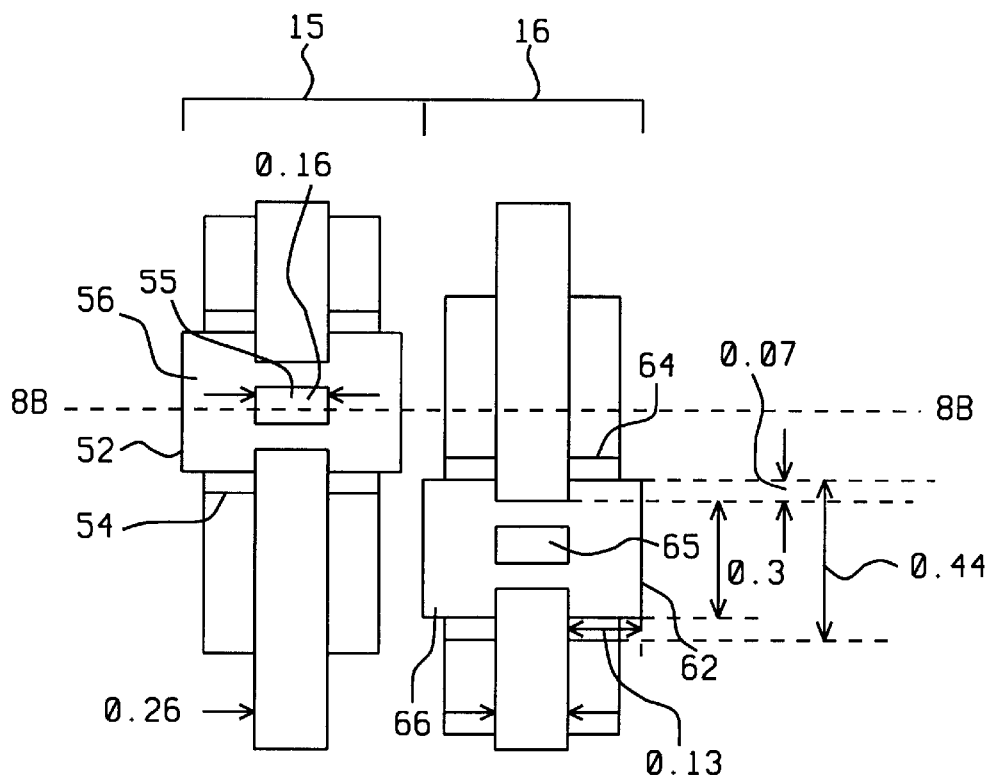
FIG. 8A is an overhead detailed schematic view of the stitch area portion of the DRAM device of FIG. 9.
Figure 8B:
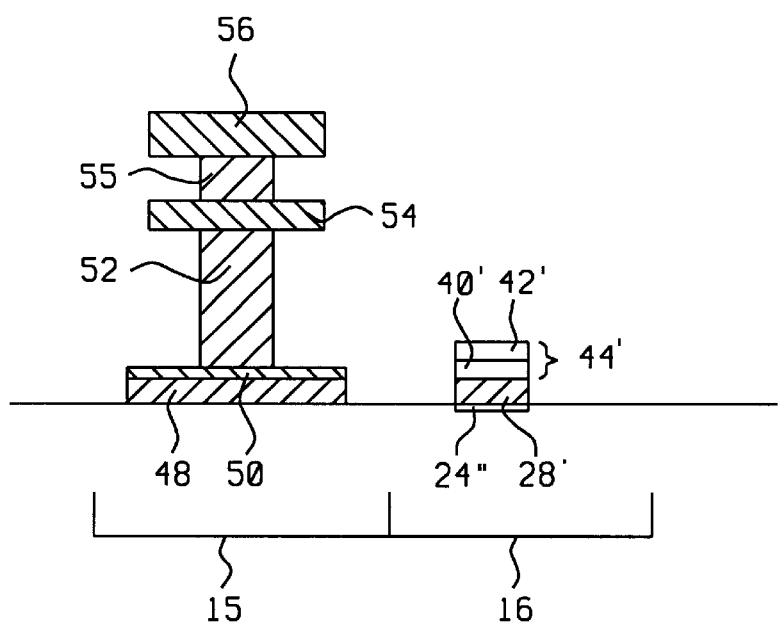
FIG. 8B is a side schematic view of FIG. 8A taken along line 8B—8B.

As shown in FIGS. 8A and 8B, further processing may then be conducted with FIG. 8B is a schematic side view of FIG. 8A taken along line 8B—8B.

Silicide layer 50 may be formed over dog-bone 48 as a contact pad for word line strapping 56. Silicide layer 50 is preferably comprised of $TiSi_x$, $CoSi_x$, and $WSi_x$, and is more preferably $WSi_x$.

Contact 52 may then be formed over silicide layer 50, and may include metal 1 island 54 and metal 2 word line strapping 56 (connected by via plug 55) with the preferred dimensions as shown in FIG. 8A.

An analogous contact 62 may also be formed over word line 28' with metal 1 island 64 and metal 2 word line strapping 66 with the preferred dimensions as shown in FIG. 8A.

Metal 1 islands 54, 64 are preferably comprised of AlCu or Cu. Metal 2 word line strappings 56, 66 are preferably comprised of AlCu or Cu.

Figure 9:
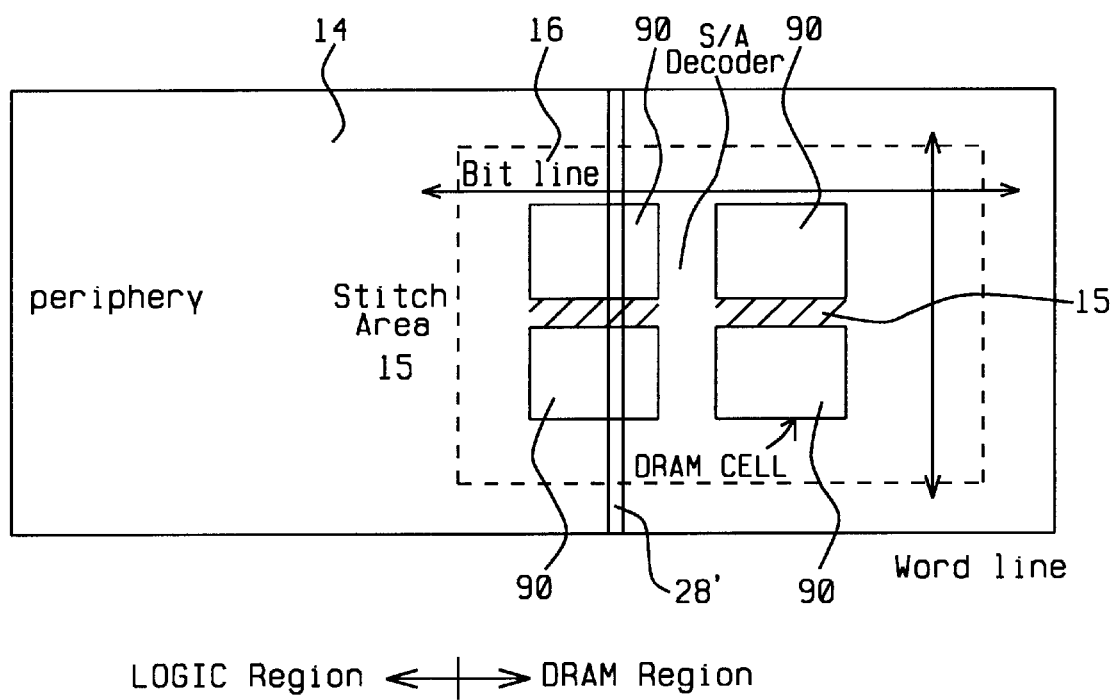
FIG. 9 is an overhead schematic view of a portion of a DRAM device.

FIG. 9 is an overhead schematic view of a portion of a DRAM device where stitch area 15 (FIG. 8A) includes word line strapping contact dog-bone 48 in an embedded DRAM layout. An embedded DRAM layout has long word lines 28' running vertically over cell areas 90, with word line strapping (metal over poly line) with many contacts (e.g. 128) to reduce resistance.

Advantages of the Present Invention

The advantages of the present invention include:

1) there is only a single polysilicon layer deposition for both the periphery logic gate and word line gate;
2) the word line hard mask improves the self-aligned etching window;
3) only the P1W and P1L masks are used to define the word lines, periphery gates, and poly dog-bone for word line strapping contact in the stitch area;
4) a common gate method is used to define periphery and word line gate can reduce process cost in embedded DRAM process.

While particular embodiments of the present invention have been illustrated and described, it is not intended to limit the invention, except as defined by the following claims.

We claim:

1. A method for fabricating a dog-bone in a DRAM device, comprising the steps of:

providing a semiconductor structure having an upper silicon layer with STIs formed therein; the semiconductor structure having a LOGIC region and a DRAM region with a stitch region overlapping each of the LOGIC and DRAM region therebetween;

forming a polysilicon layer over the semiconductor structure within the LOGIC region, DRAM region, and stitch region;

selectively implanting a dopant in the polysilicon layer within the DRAM region and a portion of the stitch region within the DRAM region to form a doped poly segment and an undoped poly segment within the LOGIC region and a portion of the stitch region within the LOGIC region;

forming a hard mask over the doped poly segment and the undoped poly segment;

patterning the hard mask to form at least one patterned first mask layer portion only over the doped poly segment within the DRAM region;

forming at least one second mask layer portion over the undoped poly segment within the LOGIC region and at least one third mask layer portion over the doped poly segment in the portion of the stitch region within the DRAM region;

etching the doped poly segment and undoped poly segment not under the first mask layer portion and or the second and third mask layer portions to form:

undoped poly periphery logic gate portions within the LOGIC region;

doped poly dog-bone within the portion of the stitch region within the DRAM region; and doped poly word lines within the DRAM region; and stripping the second and third mask layer portions to expose the undoped poly periphery logic gate portions and the doped poly dog-bone.

2. The method of claim 1, wherein the polysilicon layer has a thickness of from about 1600 to 2000 Å, and the first mask layer portion has a thickness of from about 1900 to 2500 Å.

3. The method of claim 1, wherein the polysilicon layer has a thickness of from about 1600 to 2000 Å; and the first mask layer portion comprises a lower LPTEOS layer having a thickness of from about 600 to 800 Å and an upper SiN layer having a thickness of from about 1300 to 1700 Å.

4. The method of claim 1, wherein the polysilicon layer has a thickness of from about 1700 to 1900 Å; and the first mask layer portion comprises a lower LPTEOS layer having a thickness of from about 650 to 750 Å and an upper SiN layer having a thickness of from about 1400 to 1600 Å.

5. The method of claim 1, wherein the polysilicon layer has a thickness of about 1800 Å; and the first mask layer portions comprises a lower LPTEOS layer having a thickness of about 700 Å and an upper SiN layer having a thickness of from about 1500 Å.

6. The method of claim 1, wherein the dopant is selected from a group consisting of P and As; a concentration of the P in the doped poly segment being from about 5 E 19 atoms/cm$^3$ to 5 E 21 atoms/cm$^3$ and a concentration of the As in the doped poly segment being from about 5 E 19 atoms/cm$^3$ to 5 E 21 atoms/cm$^3$.

7. The method of claim 1, wherein the dopant is selected from a group consisting of P and As; a concentration of the P in the doped poly segment being from about 1 E 20 atoms/cm$^3$ to 1 E 21 atoms/cm$^3$ and a concentration of the As in the doped poly segment being from about 1 E 20 atoms/cm$^3$ to 1 E 21 atoms/cm$^3$.

8. The method of claim 1, including the step of growing a gate oxide layer over the upper silicon layer of the semiconductor structure before the polysilicon layer formation step.

9. The method of claim 1, including the step of growing a gate oxide layer over the upper silicon layer of the semiconductor structure before the polysilicon layer formation step; the gate oxide layer having a thickness of from about 16.5 to 70 Å.

10. The method of claim 1, including the step of forming a silicide layer over the exposed doped poly dog-bone.

11. A method for fabricating a dog-bone in a DRAM device, comprising the steps of:

providing a semiconductor structure having an upper silicon layer with STIs formed therein; the semiconductor structure having a LOGIC region and a DRAM region with a stitch region overlapping each of the LOGIC and DRAM region therebetween;

forming a gate oxide layer over the upper silicon layer;

forming a polysilicon layer over the semiconductor structure within the LOGIC region, DRAM region, and stitch region;

selectively implanting a dopant in the polysilicon layer within the DRAM region and a portion of the stitch region within the DRAM region to form a doped poly segment and an undoped poly segment within the LOGIC region and a portion of the stitch region within the LOGIC region;

forming a hard mask over the doped poly segment and the undoped poly segment;

patterning the mask layer to form at least one patterned first hard mask portion only over the doped poly segment within the DRAM region;

forming at least one second mask layer portion over the undoped poly segment within the LOGIC region and at least one third mask layer portion over the doped poly segment in the portion of the stitch region within the DRAM region;

etching the doped poly segment and undoped poly segment not under the first mask layer portion and the second and third mask layer portions to form:
  undoped poly periphery logic gate portions within the LOGIC region;
  doped poly dog-bone within the portion of the stitch region within the DRAM region; and
  doped poly word lines within the DRAM region; and stripping the second and third mask layer portions to expose the undoped poly periphery logic gate portions and the doped poly dog-bone.

12. The method of claim 11, wherein the gate oxide layer has a thickness of from about 16.5 to 70 Å; the polysilicon layer has a thickness of from about 1600 to 2000 Å, and the first mask layer portion has a thickness of from about 1900 to 2500 Å.

13. The method of claim 11, wherein the gate oxide layer has a thickness of from about 40 to 60 Å; the polysilicon layer has a thickness of from about 1600 to 2000 Å; and the first mask layer portion comprises a lower LPTEOS layer having a thickness of from about 600 to 800 Å and an upper SiN layer having a thickness of from about 1300 to 1700 Å.

14. The method of claim 11, wherein the gate oxide layer has a thickness of about 50 Å; the polysilicon layer has a thickness of from about 1700 to 1900 Å; and the first mask layer portion comprises a lower LPTEOS layer having a thickness of from about 650 to 750 Å and an upper SiN layer having a thickness of from about 1400 to 1600 Å.

15. The method of claim 11, wherein the polysilicon layer has a thickness of about 1800 Å; and the first mask layer portion comprises a lower LPTFOS layer having a thickness of about 700 Å and an upper SiN layer having a thickness of from about 1500 Å.

16. The method of claim 11, wherein the dopant is selected from a group comprising P and As; a concentration of the P in the doped poly segment is from about 5 E 19 atoms/cm$^3$ to 5 E 21 atoms/cm$^3$ and a concentration of the As in the doped poly segment is from about 5 E 19 atoms/cm$^3$ to 5 E 21 atoms/cm$^3$.

17. The method of claim 11, wherein the dopant is selected from a group comprising P and As; a concentration of the P in the doped poly segment is from about 1 E 20 atoms/cm$^3$ to 1 E 21 atoms/cm$^3$ and a concentration of the As in the doped poly segment is from about 1 E 20 atoms/cm$^3$ to 1 E 21 atoms/cm$^3$.

18. The method of claim 11, including the step of forming a silicide layer over the exposed doped poly dog-bone.

19. A method for fabricating a dog-bone in a DRAM device, comprising the steps of:

providing a semiconductor structure having an upper silicon layer with STIs formed therein; the semiconductor structure having a LOGIC region and a DRAM region with a stitch region overlapping each of the LOGIC and DRAM region therebetween;

forming a polysilicon layer over the semiconductor structure within the LOGIC region, DRAM region, and stitch region;

selectively implanting a dopant in the polysilicon layer within the DRAM region and a portion of the stitch region within the DRAM region to form a doped poly segment and an undoped poly segment within the LOGIC region and a portion of the stitch region within the LOGIC region;

forming a hard mask over the doped poly segment and the undoped poly segment; the hard mask comprising a lower LPTEOS layer and an upper SiN layer;

patterning the mask layer to form at least one patterned first hard mask portion only over the doped poly segment within the DRAM region;

forming at least one second mask layer portion over the undoped poly segment within the LOGIC region and at least one third mask layer portion over the doped poly segment in the portion of the stitch region within the DRAM region;

etching the doped poly segment and undoped poly segment not under the first mask layer portion and the second and third mask layer portions to form:
  undoped poly periphery logic gate portions within the LOGIC region;
  doped poly dog-bone within the portion of the stitch region within the DRAM region; and
  doped poly word lines within the DRAM region; and stripping the second and third mask layer portions to expose the undoped poly periphery logic gate portions and the doped poly dog-bone.

20. The method of claim 19, wherein the polysilicon layer has a thickness of from about 1600 to 2000 Å, and the first mask layer portion has a thickness of from about 1900 to 2500 Å.

21. The method of claim 19, wherein the polysilicon layer has a thickness of from about 1600 to 2000 Å; and the lower LPTEOS layer has a thickness of from about 600 to 800 Å and the upper SiN layer has a thickness of from about 1300 to 1700 Å.

22. The method of claim 19, wherein the polysilicon layer has a thickness of from about 1700 to 1900 Å; and the lower LPTEOS layer has a thickness of from about 650 to 750 Å and the upper SiN layer has a thickness of from about 1400 to 1600 Å.

23. The method of claim 19, wherein the polysilicon layer has a thickness of about 1800 Å; and the lower LPTEOS layer has a thickness of about 700 Å and the upper SiN layer has a thickness of from about 1500 Å.

24. The method of claim 19, wherein the dopant is selected from a group, comprising P and As; a concentration of the P in the doped poly segment being from about 5 E 19 atoms/cm$^3$ to 5 E 21 atoms/cm$^3$ and a concentration of the As in the doped poly segment being from about 5 E 19 atoms/cm$^3$ to 5 E 21 atoms/cm$^3$.

25. The method of claim 19, wherein the dopant is selected from a group comprising P and As; a concentration of the P in the doped poly segment being from about 1 E 20 atoms/cm$^3$ to 1 E 21 atoms/cm$^3$ and a concentration of the As in the doped poly segment being from about 1 E 20 atoms/cm$^3$ to 1 E 21 atoms/cm$^3$.

26. The method of claim 19, including the step of growing a gate oxide layer over the upper silicon layer of the semiconductor structure before the polysilicon layer formation step.

27. The method of claim 19, including the step of growing a gate oxide layer over the upper silicon layer of the semiconductor structure before the polysilicon layer formation step; the gate oxide layer having a thickness of from about 16.5 to 70 Å.

28. The method of claim 19, including the step of forming a silicide layer over the exposed doped poly dog-bone.

* * * * *